United States Patent
Sawamura et al.

(10) Patent No.: US 9,864,548 B2
(45) Date of Patent: Jan. 9, 2018

(54) MEMORY MODULE, ELECTRONIC DEVICE AND METHOD

(71) Applicant: Toshiba Memory Corporation, Minato-ku (JP)

(72) Inventors: Shoji Sawamura, Yokohama (JP); Nobuhiro Kondo, Yokohama (JP); Kenichi Maeda, Kamakura (JP); Kenichiro Yoshii, Bunkyo (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 56 days.

(21) Appl. No.: 15/060,677

(22) Filed: Mar. 4, 2016

(65) Prior Publication Data

US 2017/0075630 A1    Mar. 16, 2017

Related U.S. Application Data

(60) Provisional application No. 62/216,890, filed on Sep. 10, 2015.

(51) Int. Cl.
*G06F 3/06* (2006.01)
*G11C 5/04* (2006.01)
*G11C 8/06* (2006.01)
*G11C 11/00* (2006.01)

(52) U.S. Cl.
CPC ......... *G06F 3/0659* (2013.01); *G06F 3/0604* (2013.01); *G06F 3/0685* (2013.01); *G11C 5/04* (2013.01); *G11C 8/06* (2013.01); *G11C 11/005* (2013.01)

(58) Field of Classification Search
CPC ..... G06F 3/0659; G06F 3/0604; G06F 3/0685
See application file for complete search history.

(56) References Cited

U.S. PATENT DOCUMENTS

| | | | | |
|---|---|---|---|---|
| 5,987,506 A | * | 11/1999 | Carter | G06F 9/5016 707/999.01 |
| 7,149,873 B2 | * | 12/2006 | Mohideen | G06F 12/109 711/212 |
| 2002/0188929 A1 | * | 12/2002 | Cyran | G06F 12/0623 717/125 |
| 2004/0123068 A1 | * | 6/2004 | Hashimoto | G06F 12/0866 711/206 |

(Continued)

FOREIGN PATENT DOCUMENTS

| | | |
|---|---|---|
| JP | 8-101802 | 4/1996 |
| JP | 2001-256108 | 9/2001 |
| JP | 2005-216053 | 8/2005 |

*Primary Examiner* — Prasith Thammavong
(74) *Attorney, Agent, or Firm* — Oblon, McClelland, Maier & Neustadt, L.L.P.

(57) ABSTRACT

According to one embodiment, a memory module includes a volatile memory, a nonvolatile memory, and a controller. The volatile memory is data readable and writable. The nonvolatile memory is data readable and writable and stores therein correspondence information containing an attribute indicating any of volatile, nonvolatile, and both of volatile and nonvolatile associated with an address in an address space assigned to the volatile memory and the nonvolatile memory. The controller reads data from and writes data to the volatile memory or the nonvolatile memory, referring to the correspondence information.

15 Claims, 6 Drawing Sheets

(56) References Cited

U.S. PATENT DOCUMENTS

| | | | |
|---|---|---|---|
| 2005/0021918 A1* | 1/2005 | Hwang | G06F 12/1433 |
| | | | 711/163 |
| 2009/0113114 A1* | 4/2009 | Berenbaum | G06F 12/1433 |
| | | | 711/103 |
| 2010/0202238 A1* | 8/2010 | Moshayedi | G06F 11/1658 |
| | | | 365/228 |
| 2012/0117658 A1* | 5/2012 | Haga | G06F 21/64 |
| | | | 726/26 |

* cited by examiner

MEMORY MODULE, ELECTRONIC DEVICE AND METHOD

CROSS-REFERENCE TO RELATED APPLICATIONS

This application is based upon and claims the benefit of priority from U.S. Provisional Application No. 62/216,890, filed on Sep. 10, 2015; the entire contents of which are incorporated herein by reference.

FIELD

Embodiments described herein relate generally to a memory module, an electronic device, and a method.

BACKGROUND

Conventionally, there are two kinds of storage devices, i.e., a high-speed volatile storage device and a lower-speed nonvolatile storage device than the volatile storage device. By a conventional technique, it is not possible to directly refer to data in the nonvolatile storage device from a processor of a computer. The data stored in the nonvolatile storage device is loaded into the volatile storage device before used.

Such a conventional technique does not consider access efficiency to the storage device.

DETAILED DESCRIPTION

In general, according to one embodiment, a memory module includes a volatile memory, a nonvolatile memory, and a controller. The volatile memory is data readable and writable. The nonvolatile memory is data readable and writable and stores therein correspondence information containing an attribute indicating any of volatile, nonvolatile, and both of volatile and nonvolatile associated with an address in an address space assigned to the volatile memory and the nonvolatile memory. The controller reads data from and writes data to the volatile memory or the nonvolatile memory, referring to the correspondence information.

Exemplary embodiments of a memory module, an electronic device, and a method will be explained below in detail with reference to the accompanying drawings. The present invention should be not limited to the following embodiments.

Figure 1:
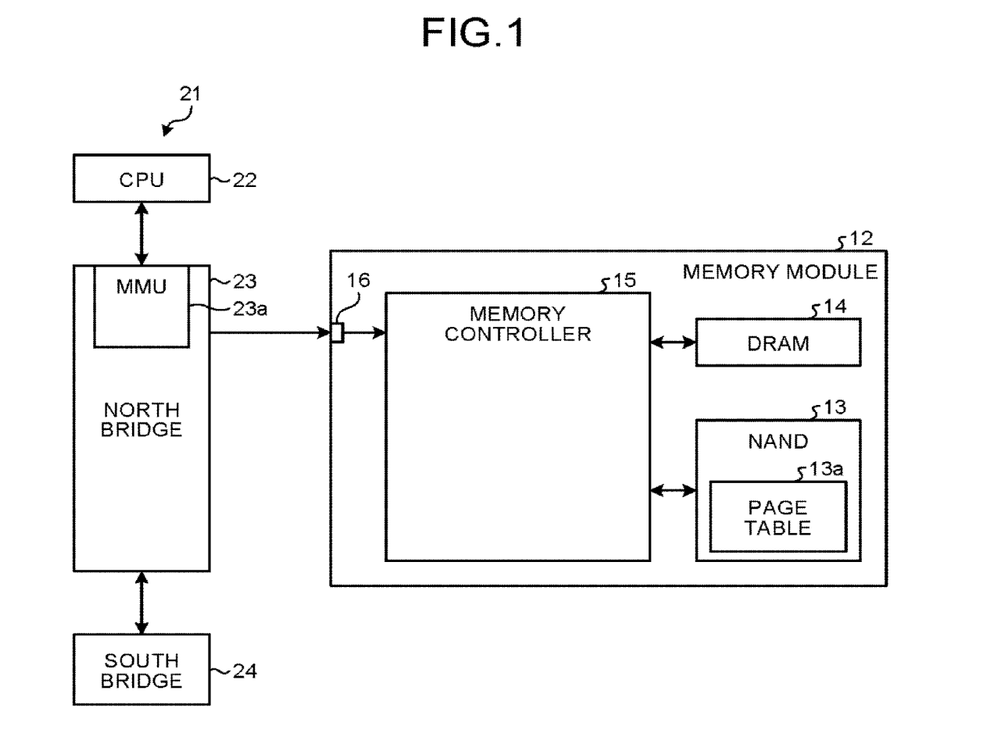
FIG. 1 is a diagram illustrating a hardware configuration example of an electronic device according to an embodiment.

FIG. 1 is a diagram illustrating an example of a hardware configuration of an electronic device according to an embodiment. As illustrated in FIG. 1, an electronic device 21 includes a CPU (Central Processing Unit) 22, a north bridge 23, a south bridge 24, and a memory module 12, for example.

The CPU 22 controls the entire electronic device 21. The north bridge 23 and the south bridge 24 function as input/output interfaces.

The south bridge 24 is an interface handling relatively low-speed data. For example, a PCIe, a SATA, or the like (not illustrated) is connected to the south bridge 24.

The north bridge 23 is an interface that has a memory management unit (MMU) 23a, for example, and handles high-speed data. For example, the memory module 12, a graphic board (not illustrated), or the like is connected to the north bridge 23.

The MMU 23a controls the memory module 12 and other elements in accordance with an operating system executed by the CPU 22. In the present embodiment, when receiving a data read/write command from the CPU 22, the MMU 23a starts an access to the memory module 12 for data read or data write. upon receiving such a command, the MMU 23a checks validity of the access, reads out a page table 13a that is arranged on a memory and stores necessity of information conversion and the like, performs a necessary processing to the table, and outputs an access command to the memory module 12.

The memory module 12 includes a NAND flash memory (NAND) 13, a DRAM 14, a memory controller 15, and a plurality of pins 16. The memory module 12 according to the present embodiment is a memory device connected to the north bridge 23 via the plurality of pins 16.

The plurality of pins 16 are connecting terminals to the electronic device 21, and are used in transmission/reception of information after the connection.

The NAND flash memory (NAND) 13 is used as a nonvolatile memory. In the present embodiment, the nonvolatile memory should not be limited to the NAND flash memory, and can be an MRAM (Magnetoresistive RAM) or a ReRAM (Resistive RAM), for example.

The NAND flash memory (NAND) 13 is data readable and writable and includes the page table 13a. The page table 13a is a table for enabling an access to an address space formed by the NAND flash memory (NAND) 13 and the DRAM 14. Due to this configuration, the CPU 22 can make a direct access to a memory space formed by the NAND flash memory (NAND) 13 and the DRAM 14.

The DRAM 14 is used as a data readable and writable volatile memory.

The memory controller 15 controls an access to the NAND 13 and the DRAM 14 in response to a request from the CPU 22. For example, the memory controller 15 converts a virtual address into a physical address, referring to the page table 13a and accesses the DRAM 14 or the NAND 13 in accordance with the physical address. The memory controller 15 according to the present embodiment recognizes the structure of the page table 13a so that it can recognize information stored in the page table 13a and execute the access control in accordance with the information.

Figure 2:
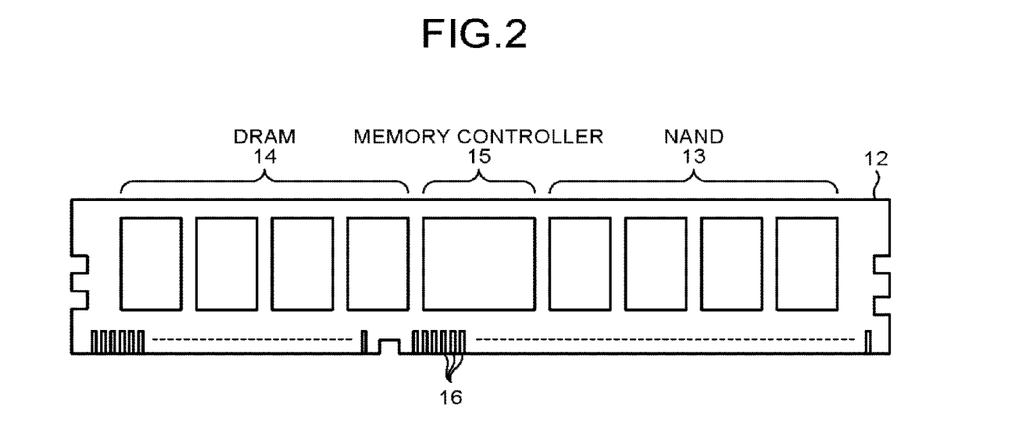
FIG. 2 is a diagram illustrating a configuration example of a memory module according to the embodiment.

FIG. 2 is a diagram illustrating a configuration example of the memory module 12 according to the present embodiment. The NAND 13, the DRAM 14, and the memory controller 15 are provided on a board of the memory module 12, as illustrated in FIG. 2. The memory controller 15 has an interface conforming to a DRAM standard, for example, DDR2 (Double Date Rate 2) or DDR3 (Double Date Rate 3). The interface is connected to the plurality of pins 16 provided on the board of the memory module 12, although not illustrated.

The plurality of pins 16 are inserted into a slot (not illustrated) electrically connected to the north bridge 23, so that the memory module 12 is connected to the north bridge 23.

The memory module 12 according to the present embodiment is a memory device conforming to a DIMM standard. However, the memory device in the present embodiment should not be limited to devices conforming to the DIMM standard, but may be a different memory device. For example, the memory device according to the present embodiment may be a memory device applicable to a memory board other than boards conforming to the DIMM standard. Further, the memory device according to the present embodiment may be one other than the memory device applicable to the memory board, for example, a memory device that is mounted on a board or a semiconductor substrate together with other circuit components.

Figure 3:
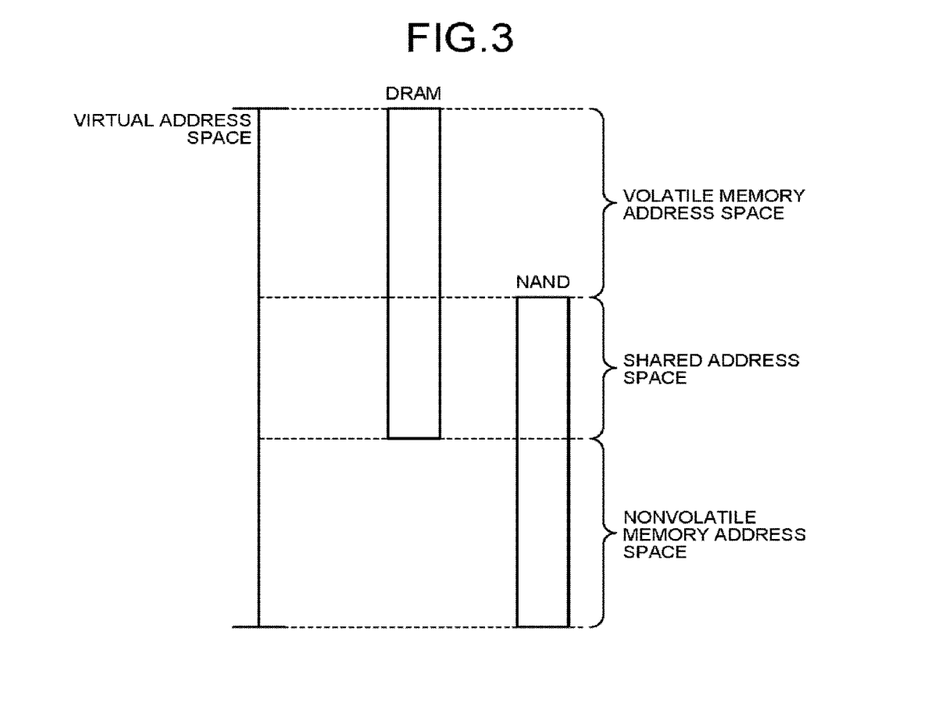
FIG. 3 is a diagram illustrating an example of a virtual address space achieved by a DRAM and a NAND according to the embodiment.

FIG. 3 is a diagram illustrating an example of a virtual address space achieved by the DRAM 14 and the NAND 13 according to the present embodiment. In the present embodiment, the CPU 22 can request an access to the virtual address space as illustrated in FIG. 3.

The virtual address space is formed of a volatile memory address space, a shared address space, and a nonvolatile memory address space, as illustrated in FIG. 3. As illustrated in FIG. 3, the CPU 22 can access the volatile memory address space formed only by the DRAM 14 and the nonvolatile memory address space formed only by the NAND 13.

Further, the shared address space is assigned to both the DRAM 14 and the NAND 13 and defined in the virtual address space according to the present embodiment. The shared address space is provided for a high-speed access to data stored in the nonvolatile memory. In the present embodiment, data is stored in the NAND 13 and copied onto the DRAM 14 when a data access is requested from the CPU 22. Thereafter, both a high-speed access and data holding at occurrence of power-off can be achieved by making an access to the DRAM 14.

Figure 4:
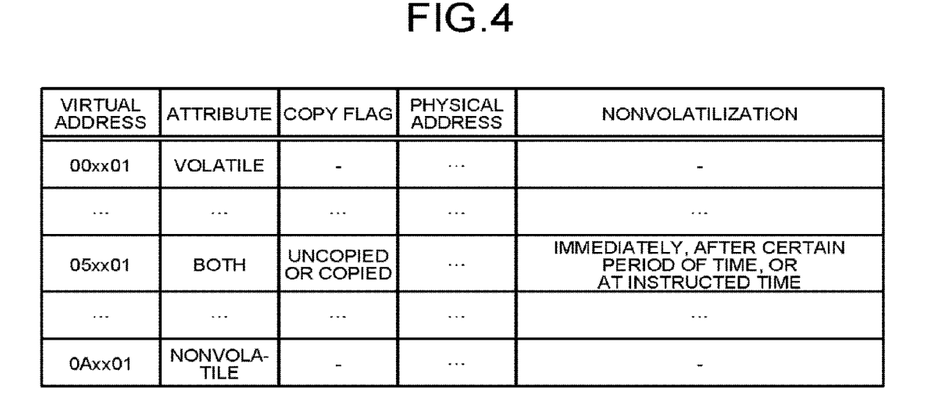
FIG. 4 is a diagram illustrating an example of a portion of a configuration of a page table according to the embodiment.

FIG. 4 is a diagram illustrating an example of a portion of the structure of the page table 13a according to the present embodiment. As illustrated in FIG. 4, the page table 13a stores a virtual address, an attribute, a copy flag, a physical address, and nonvolatilization in association with each other. An access permission is also stored in the page table 13a, although it is not illustrated in FIG. 4.

As illustrated in FIG. 4, it is possible to achieve address conversion by associating the virtual address and the physical address and access the DRAM 14 and the NAND 13 directly.

The attribute is set to any one of "volatile" (DRAM 14), "nonvolatile" (NAND 13), and "both" (DRAM 14 and NAND 13). The CPU 22 can identify an access destination, referring to the attribute. In this manner, the page table 13a according to the present embodiment associates the attribute (indicating one of "volatile", "nonvolatile", and "both" of "volatile" and "nonvolatile") with each virtual address in the virtual address space assigned to the DRAM 14 and the NAND 13.

The attribute "both" (DRAM 14 and NAND 13) means that an address concerned is nonvolatile (NAND 13) and an object of a high-speed access. That is, to store data at the address concerned d in the NAND 13 and access the address, the data at the address is loaded into the DRAM 14. In addition, when the attribute of a virtual address is "both" (DRAM 14 and NAND 13) in the page table 13a, the virtual address is convertible to both a physical address in the DRAM 14 and a physical address in the NAND 13.

The copy flag is a flag for holding a copied or uncopied state of data at the address concerned on the DRAM 14 when its attribute is "both". "Uncopied" is set in a case where the data has not been copied into the DRAM 14, and "copied" is set in a case where the data has been copied into the DRAM 14.

The nonvolatilization is a flag for holding a timing at which updated data is written to the NAND 13, when at a virtual address having the attribute "both", copied data on the DRAM 14 has been updated. In the present embodiment, the nonvolatilization timing is set to "immediately", "after a certain period of time", and "at an instructed time".

In the present embodiment, the memory controller 15 also executes various controls such as data read/write over the DRAM 14 and the NAND 13, referring to the page table 13a.

Figure 5:
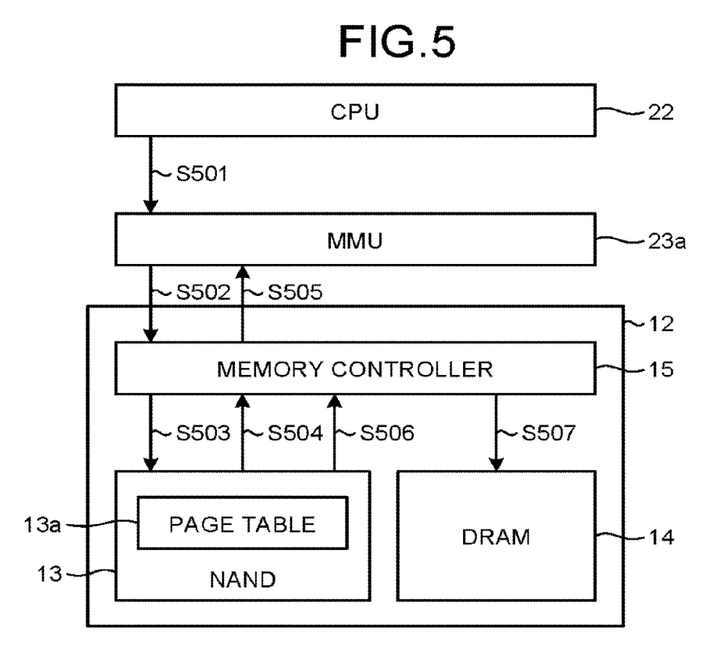
FIG. 5 is a diagram illustrating a memory access process to a virtual address having an attribute "both" in the electronic device according to the embodiment.

Next, an example of a memory access to a virtual address having an attribute "both" in the electronic device 21 according to the present embodiment is described. FIG. 5 is a diagram illustrating the above process in the electronic device 21 according to the present embodiment.

As illustrated in FIG. 5, the CPU 22 outputs a memory access command to the MMU 23a (S501). The MMU 23a then outputs a memory attribute query for a virtual address indicated by the memory access command to the memory controller 15 in response to the memory access command (S502).

The memory controller 15 then accesses the page table 13a of the NAND 13 for the memory attribute query (S503). Thereby, the memory controller 15 acquires information on the virtual address indicated by the memory access command as a memory attribute response (S504).

The memory controller 15 then passes the information on the virtual address indicated by the memory access command to the MMU 23a as the memory attribute response (S505). Thereby, the MMU 23a can control a memory access based on the information on the virtual address indicated by the memory access command.

Meanwhile, when determining that the attribute associated with the virtual address is "both", the memory controller 15 determines whether the copy flag for the virtual address is "uncopied". Upon determining that the copy flag is "uncopied", the memory controller 15 accesses a physical address of the NAND 13 corresponding to the virtual address and reads out the data for copy (S506). The memory controller 15 writes the read data to a physical address of the DRAM 14 corresponding to the virtual address (S507). Thereafter, a high-speed access to the data is feasible.

When reading out data from a virtual address with the attribute "both" in the page table 13a, the memory controller 15 according to the present embodiment controls a data read from the NAND 13 assigned a physical address converted from the virtual address and a data write to the DRAM 14 assigned a physical address converted from the virtual address. Such control is executed when the copy flag is "uncopied". In other words, when reading out the data from the virtual address with the attribute "both", the memory controller 15 writes the data to the DRAM 14 assigned the physical address converted from the virtual address in a case where the copy flag for the virtual address indicates "uncopied", that is, that the data has not been written to the DRAM 14. This makes it possible for the memory controller 15 to generate a response from the DRAM 14 and respond to a new command from the MMU 23a more quickly than to generate the response from the NAND 13 access command.

In the present embodiment, the CPU 22 issues an instruction for referring to the page table 13a as the memory attribute query, triggered by the memory access command sent to the MMU 23a. The memory controller 15 compares the instruction with position information of the page table stored therein, to able to recognize that the received instruction is an instruction for the page table.

Figure 6:
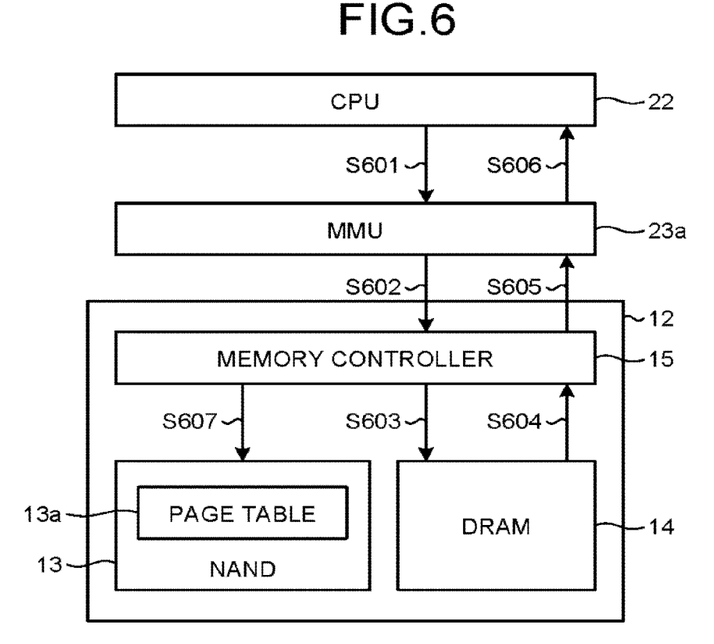
FIG. 6 is a diagram illustrating a memory access process that is performed after the process of FIG. 5 in the electronic device according to the embodiment.

Next, described is an example of a memory access after the process of FIG. 5 in the electronic device 21 according to the present embodiment. FIG. 6 is a diagram illustrating the above process in the electronic device 21 according to the present embodiment.

First, the CPU 22 outputs a memory access command (a data read command or a data write command) to the MMU 23a (S601). The MMU 23a identifies a physical address of the DRAM 14 corresponding to a virtual address of the memory access command input at S601 from the memory attribute response received at S505, and outputs a memory access command for the physical address to the memory controller 15 (S602).

The memory controller 15 then accesses the physical address specified by the memory access command (S603). This access destination is a write destination at S507.

The memory controller 15 reads out or writes data from/to the physical address (S604) and outputs the read data or a write response to the MMU 23a as a memory access response (S605). The MMU 23a passes the data or the write response received from the memory controller 15 to the CPU 22 as the memory access response (S606).

Subsequently, the memory controller 15 performs nonvolatilization, that is, copying data updated in the DRAM 14 onto the NAND 13 (S607). This nonvolatilization is performed based on a parameter ("immediately", "after a certain period of time", and "at an instructed time") set as the nonvolatilization in the page table 13a.

By the above process, the memory controller 15 can read or write the data from/to the DRAM 14 at a high speed after copying data stored in the NAND 13 onto the DRAM 14. In the present embodiment, when the memory access command received from the MMU 23a is a data write, data is copied onto the NAND 13 for nonvolatilization in accordance with a requirement of nonvolatilization. Therefore, both a high-speed response from the DRAM 14 and nonvolatilization can be achieved.

Figure 7:
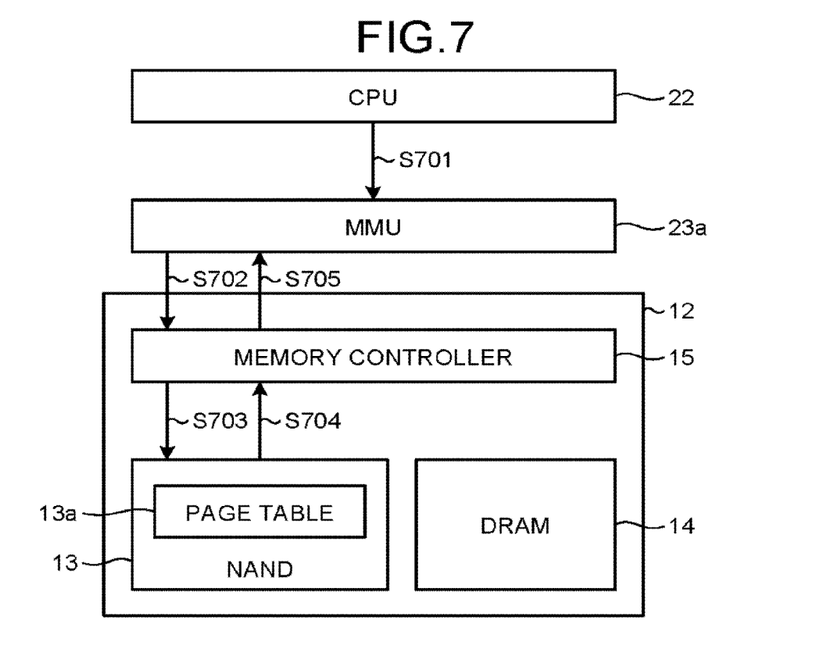
FIG. 7 is a diagram illustrating a memory access process to a virtual address having an attribute "nonvolatile" or "volatile" in the electronic device according to the embodiment.

Next, described is an example of a memory access to a virtual address having an attribute "nonvolatile" or "volatile" in the electronic device 21 according to the present embodiment. First, an example of the attribute "nonvolatile" and data stored in the NAND 13 as a non-object of a high-speed access is described. FIG. 7 is a diagram illustrating the above process in the electronic device 21 according to the present embodiment.

As illustrated in FIG. 7, the CPU 22 outputs a memory access command to the MMU 23a (S701). The MMU 23a outputs a memory attribute query for a virtual address indicated by the memory access command to the memory controller 15 in response to the memory access command (S702).

The memory controller 15 then accesses the page table 13a of the NAND 13 for the memory attribute query (S703). Thereby, the memory controller 15 acquires information on the virtual address indicated by the memory access command as a memory attribute response (S704).

The memory controller 15 then passes the information on the virtual address indicated by the memory access command to the MMU 23a as the memory attribute response (S705). The information on the virtual address contains the attribute "nonvolatile" or "volatile" and a physical address. Therefore, the MMU 23a can control a memory access to the physical address corresponding to the memory access command.

Figure 8:
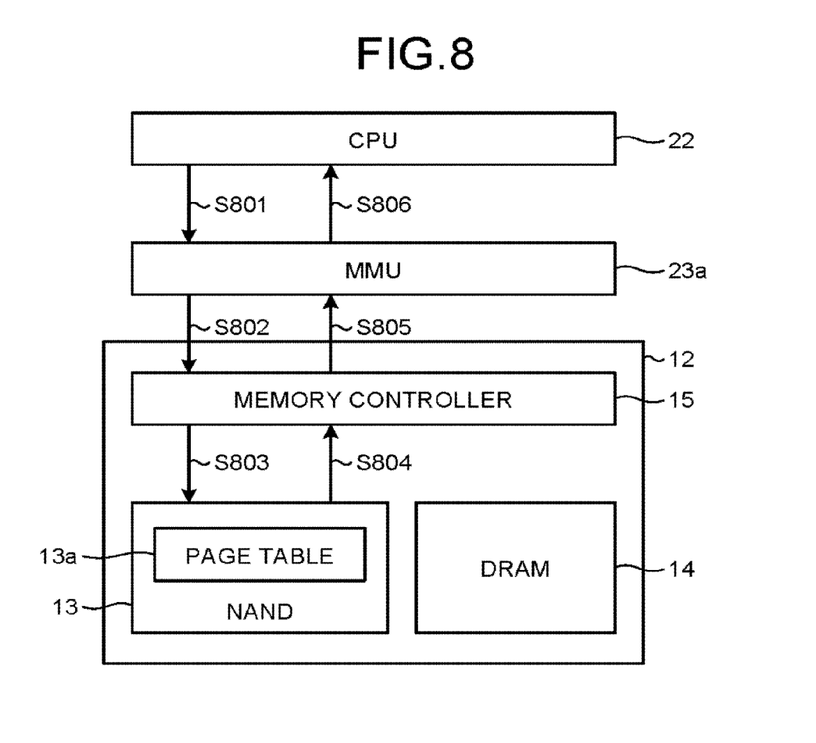
FIG. 8 is a diagram illustrating a memory access process in a case where information on a virtual address includes an attribute "nonvolatile" in the electronic device according to the embodiment.

Next, another example of a memory access when the information on the virtual address acquired as the memory attribute response contains the attribute "nonvolatile" is described. FIG. 8 is a diagram illustrating the above process in the electronic device 21 according to the present embodiment.

First, the CPU 22 outputs a memory access command (a data read command or a data write command) to the MMU 23a (S801). The MMU 23a identifies a physical address of the NAND 13 corresponding to a virtual address of the memory access command input at S801 from the memory attribute response received at S705, and outputs a memory access command for the physical address to the memory controller 15 (S802).

The memory controller 15 then accesses the physical address on the NAND 13 specified by the memory access command (S803).

The memory controller 15 then reads out or writes data from/to the physical address (S804) and outputs the read data or written data to the MMU 23a as a memory access response (S805). The MMU 23a receives the memory access response from the memory controller 15 and passes it to the CPU 22 (S806).

By the above process, the memory controller 15 can achieve data read and data write from/to the NAND 13. As described in the above process, the memory controller 15 recognizes a virtual address having the attribute "nonvolatile" as a non-object of a high-speed memory access, and directly generates a response from the NAND 13 when newly receiving a memory access command from the MMU 23a. In this manner, the memory controller 15 is able to control unnecessary data not to be copied onto the DRAM 14.

Figure 9:
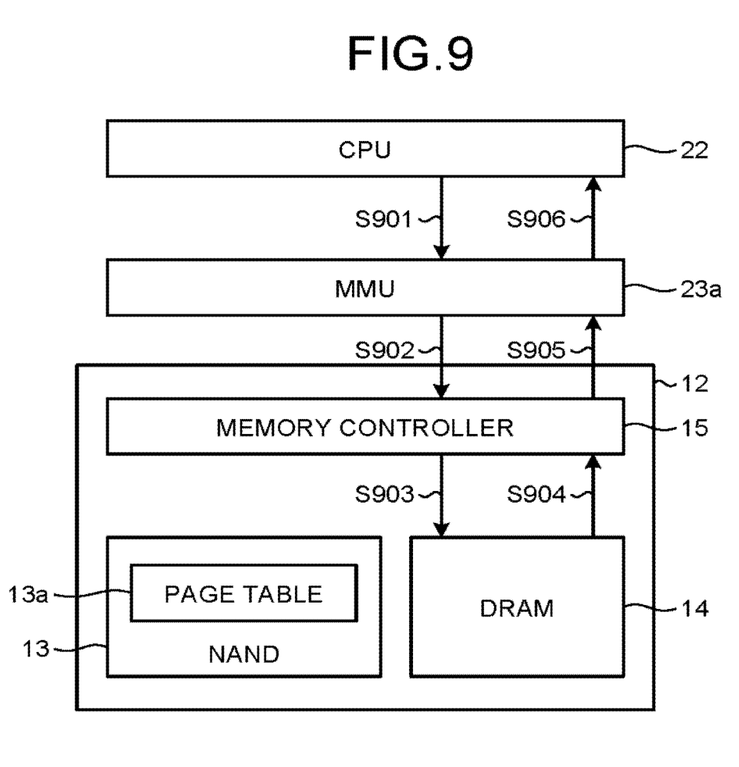
FIG. 9 is a diagram illustrating a memory access process in a case where information on a virtual address includes an attribute "volatile" in the electronic device according to the embodiment.

Referring to FIG. 8, the example in which the information on the virtual address read in accordance with the memory attribute query contains the attribute "nonvolatile" has been described. Next, described is an example of a memory access when the information on the virtual address contains the attribute "volatile". FIG. 9 is a diagram illustrating the above process in the electronic device 21 according to the present embodiment.

First, the CPU 22 outputs a memory access command (a data read command or a data write command) to the MMU 23a (S901). The MMU 23a identifies a physical address of the DRAM 14 corresponding to a virtual address of the memory access command input at S901 from the memory attribute response, and outputs the memory access command for the physical address to the memory controller 15 (S902).

The memory controller 15 then accesses the physical address specified by the memory access command on the DRAM 14 (S903).

The memory controller 15 reads out or writes data from/to the physical address (S904) and outputs the read data or the written data to the MMU 23a as a memory access response (3905). The MMU 23a receives the memory access response from the memory controller 15 and passes it to the CPU 22 (S906).

By the above process, the memory controller 15 is able to read and write the data from/to the DRAM 14.

Figure 10:
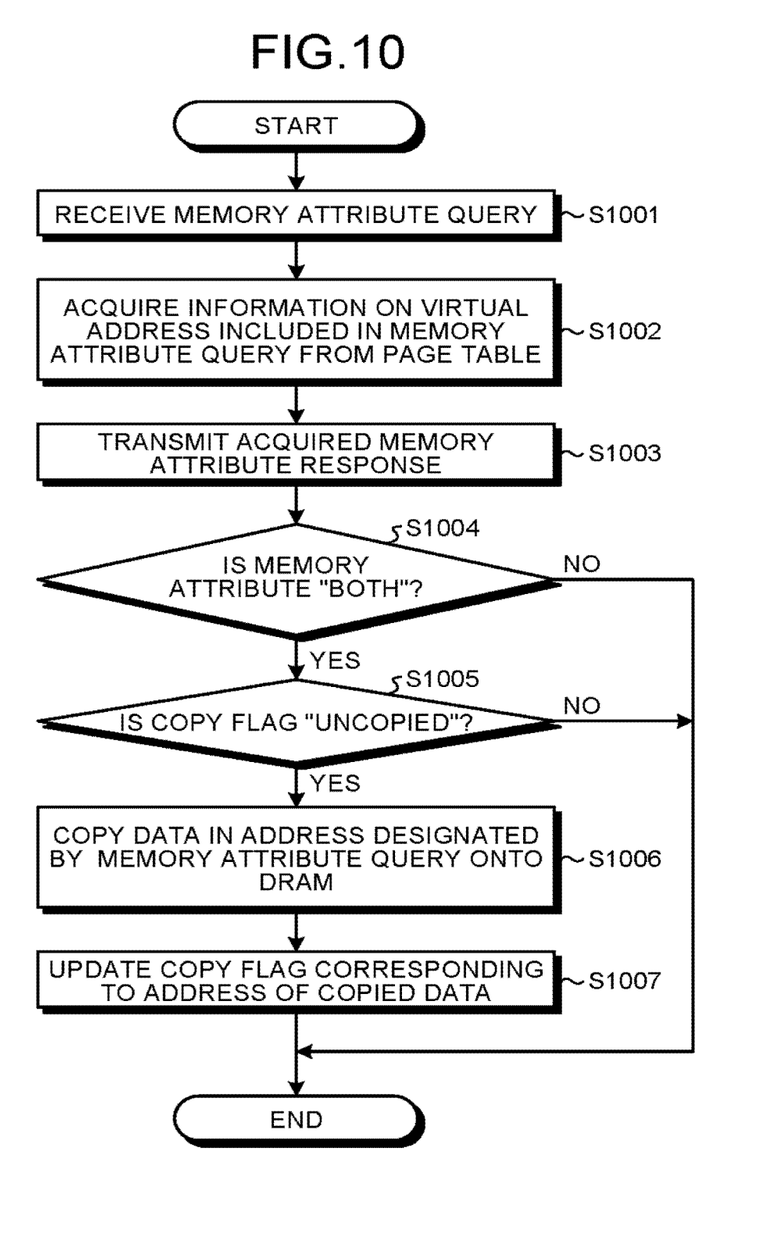
FIG. 10 is a flowchart illustrating a process by a memory controller according to the embodiment when receiving a memory attribute query for a virtual address.

Next, described is a process by the memory controller 15 when having received a memory attribute query for a virtual address. FIG. 10 is a flowchart for the above process by the memory controller 15 according to the present embodiment.

First, the memory controller 15 receives the memory attribute query from the MMU 23a (S1001).

The memory controller 15 then acquires information on the virtual address included in the received memory attribute query from the page table 13a (S1002).

The memory controller 15 sends the acquired information on the virtual address to the MMU 23a as a memory attribute response (S1003).

The memory controller 15 determines whether an attribute included in the acquired information is "both" (S1004). The memory controller 15 ends the process when determining that the attribute is not "both" (NO at S1004). On the other hand, upon determining that the attribute is "both" (YES at S1004), the memory controller 15 then determines whether a copy flag included in the acquired information is "uncopied" (S1005). The memory controller 15 ends the process, upon determining that the copy flag is not "uncopied" (NO at S1005).

When determining that the copy flag included in the acquired information is "uncopied" (YES at S1005), the memory controller 15 copies data at the address designated by the memory attribute query onto the DRAM 14 (S1006).

The memory controller 15 then updates the copy flag for the virtual address of the copied data to "copied" (S1007).

By the above process, the memory controller 15 can perform an operation in accordance with the memory attribute query from the MMU 23a and can copy the data stored in the NAND 13 onto the DRAM 14.

By the conventional technique, an operating system of an electronic device cannot directly access data stored in a nonvolatile memory such as an SSD. For this reason, the conventional operating system needs to load the data stored in a storage device such as an SSD into a DRAM and the like for executing an operation.

On the other hand, the electronic device 21 and the memory module 12 including the above configurations according to the present embodiment can directly access the data stored in the nonvolatile memory such as the NAND 13. That is, they can improve processing efficiency because of the direct data access to the NAND 13 as long as the data is stored in the NAND 13, eliminating the necessity to load the data from the SSD into the DRAM.

Further, in the electronic device 21 according to the present embodiment, the operating system can be stored in the NAND 13 of the memory module 12 starts up from the NAND 13. Thereby the start-up of the operating system can be improved.

Furthermore, when writing data, the operating system may specify the attribute of the data. Due to this configuration, when receiving a data storing command from an application or the like, the operating system can designate an appropriate storing destination for the data from the DRAM 14 and the NAND 13 in accordance with the storing command.

In the electronic device 21 and the memory module 12 according to the present embodiment, deterioration of the NAND 13 can be prevented because unnecessary nonvolatilization is not performed. Also, it is unnecessary to load all data into the DRAM 14, making it possible to reduce the memory capacity of the DRAM 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a data readable and writable volatile memory;
   a data readable and writable nonvolatile memory that stores therein correspondence information, the correspondence information including an attribute of a virtual address in a virtual address space, the virtual address space including a first space assigned to only the volatile memory, a second space assigned to only the nonvolatile memory, and a third space assigned to both of the volatile memory and the nonvolatile memory, the attribute including a first attribute indicating that a first virtual address in the first space corresponds to a first physical address of the volatile memory, a second attribute indicating that a second virtual address in the second space corresponds to a second physical address of the nonvolatile memory, and a third attribute indicating that a third virtual address in the third space corresponds to both of a third physical address of the volatile memory and a fourth physical address of the nonvolatile memory; and
   a controller that reads data from and write data to the volatile memory or the nonvolatile memory based on the correspondence information.

2. The memory device of claim 1, wherein, in a case where the controller reads data from the third virtual address based on the correspondence information, the controller reads data from the fourth physical address of the nonvolatile memory and writes the data to the third physical address of the volatile memory.

3. The memory device of claim 2, wherein
   the correspondence information in the nonvolatile memory further includes first information indicating whether or not the data has been written to the third physical address of the volatile memory, and
   in a case where the controller reads the data from the third virtual address and the first information indicates that the data has not been written to the third physical address of the volatile memory, the controller writes the data to the third physical address of the volatile memory.

4. The memory device according to claim 2, wherein
the correspondence information in the nonvolatile memory further includes second information indicating a timing at which nonvolatilization is performed on the data of the third virtual address, and the controller writes, to the fourth physical address of the nonvolatile memory, the data written to the third physical address of the volatile memory in accordance with the second information.

5. The memory device of claim 1, wherein the memory device is a memory device conforming to a DIMM standard, in which the volatile memory, the nonvolatile memory, and the controller are mounted on one board.

6. An electronic device comprising:
a memory device including a data readable and data writable volatile memory, a data readable and data writable nonvolatile memory that stores therein correspondence information including an attribute of a virtual address in a virtual address space, and a controller that reads data from and write data to the volatile memory or the nonvolatile memory, based on the correspondence information, the virtual address space including a first space assigned to only the volatile memory, a second space assigned to only the nonvolatile memory, and a third space assigned to both of the volatile memory and the nonvolatile memory, the attribute including a first attribute indicating that a first virtual address in the first space corresponds to a first physical address of the volatile memory, a second attribute indicating that a second virtual address in the second space corresponds to a second physical address of the nonvolatile memory, and a third attribute indicating that a third virtual address in the third space corresponds to both of a third physical address of the volatile memory and a fourth physical address of the nonvolatile memory; and
a processor that outputs a memory access command to the memory device.

7. The electronic device of claim 6, wherein, in a case where the controller of the memory device reads data from the third virtual address based on the correspondence information, the controller reads data from the fourth physical address of the nonvolatile memory and writes the data to the third physical address of the volatile memory.

8. The electronic device of claim 7, wherein
the correspondence information in the nonvolatile memory of the memory device further includes first information indicating whether or not the data has been written to the third physical address of the volatile memory, and
in a case where the controller of the memory device reads the data from the third virtual address and the first information indicates that the data has not been written to the third physical address of the volatile memory, the controller writes the data to the third physical address of the volatile memory.

9. The electronic device of claim 7, wherein
the correspondence information in the nonvolatile memory of the memory device further includes second information indicating a timing at which nonvolatilization is performed on the data of the third virtual address, and
the controller of the memory device writes, to the fourth physical address of the nonvolatile memory, the data written to the third physical address of the volatile memory in accordance with the second information.

10. The electronic device of claim 6, wherein the memory device is a memory device conforming to a DIMM standard, in which the volatile memory, the nonvolatile memory, and the controller are mounted on one board.

11. A method executed in an electronic device comprising a memory device including a data readable and writable volatile memory and a data readable and writable nonvolatile memory that stores therein correspondence information including an attribute of a virtual address in a virtual address space, the virtual address space including a first space assigned to only the volatile memory, a second space assigned to only the nonvolatile memory, and a third space assigned to both of the volatile memory and the nonvolatile memory, the attribute including a first attribute indicating that a first virtual address in the first space corresponds to a first physical address of the volatile memory, a second attribute indicating that a second virtual address in the second space corresponds to a second physical address of the nonvolatile memory, and a third attribute indicating that a third virtual address in the third space corresponds to both of a third physical address of the volatile memory and a fourth physical address of the nonvolatile memory, the method comprising:
receiving a memory access command for the memory device; and
reading data from and writing data to the volatile memory or the nonvolatile memory based on the correspondence information when receiving the memory access command.

12. The method of claim 11, further comprising in a case where reading data from the third virtual address based on the correspondence information, reading the data from the fourth physical address of the nonvolatile memory and writing the data to the third physical address of the volatile memory.

13. The method of claim 12, wherein
the correspondence information in the nonvolatile memory of the memory device further includes first information indicating whether or not the data has been written to the third physical address of the volatile memory, the method further comprising
in a case where reading the data from the third virtual address and the first information indicates that the data has not been written to the third physical address of the volatile memory, writing the data to the third physical address of the volatile memory.

14. The method of claim 12, wherein
the correspondence information in the nonvolatile memory of the memory device further includes second information indicating a timing at which nonvolatilization is performed on the data of the third virtual address, the method further comprising
writing, to the fourth physical address of the nonvolatile memory, the data written to the third physical address of the volatile memory in accordance with the second information.

15. The method of claim 11, wherein the memory device is a memory device conforming to a DIMM standard, in which the volatile memory, the nonvolatile memory, and the controller are mounted on one board.

* * * * *